(12) United States Patent
Jerman et al.

(10) Patent No.: US 6,759,734 B2
(45) Date of Patent: Jul. 6, 2004

(54) MINIATURE DEVICE WITH INCREASED INSULATIVE SPACING AND METHOD FOR MAKING SAME

(75) Inventors: John H. Jerman, Palo Alto, CA (US); John D. Grade, Mountain View, CA (US)

(73) Assignee: Iolon, Inc., San Jose, CA (US)

( * ) Notice: Subject to any disclaimer, the term of this patent is extended or adjusted under 35 U.S.C. 154(b) by 0 days.

(21) Appl. No.: 10/100,371

(22) Filed: Mar. 14, 2002

(65) Prior Publication Data

US 2002/0149292 A1 Oct. 17, 2002

Related U.S. Application Data

(60) Provisional application No. 60/276,686, filed on Mar. 15, 2001.

(51) Int. Cl.$^7$ .............................................. H01L 23/02
(52) U.S. Cl. .................. 257/678; 257/355; 257/358; 257/691; 257/750; 257/758
(58) Field of Search ................................. 257/678, 355, 257/356, 691, 750, 758

(56) References Cited

U.S. PATENT DOCUMENTS

| | | | | |
|---|---|---|---|---|
| 3,916,434 A | * | 10/1975 | Garboushian | ................ 257/678 |
| RE31,470 E | * | 12/1983 | Bedard et al. | ............... 333/204 |
| 5,517,042 A | * | 5/1996 | Kitamura | ..................... 257/207 |
| 5,961,849 A | * | 10/1999 | Bostock et al. | ................ 216/24 |
| 2002/0079550 A1 | * | 6/2002 | Daneman et al. | ........... 257/459 |
| 2002/0162675 A1 | * | 11/2002 | Jerman et al. | .............. 174/52.1 |

* cited by examiner

Primary Examiner—Jasmine Clark
(74) Attorney, Agent, or Firm—Dorsey & Whitney LLP

(57) ABSTRACT

The present invention provides a miniature device that comprises a grounded layer, an insulative layer overlying the grounded layer and a conductive layer overlying the insulative layer wherein the insulative spacing between the conductive and grounded layers is increased so as to inhibit electrical shorting between the conductive layer and grounded layers. A method of making miniature devices is also provided.

30 Claims, 3 Drawing Sheets

MINIATURE DEVICE WITH INCREASED INSULATIVE SPACING AND METHOD FOR MAKING SAME

CROSS-REFERENCE TO RELATED APPLICATION

The application claims priority to U.S. provisional patent application Serial No. 60/276,686 filed Mar. 15, 2001, the entire content of which is incorporated herein by this reference.

FIELD OF THE INVENTION

The present invention relates generally to miniature devices and more particularly to miniature devices having layered structures.

BACKGROUND

Deep reactive ion etched electrostatic actuators have great utility for use in systems, particularly systems having optical components. These actuators have the potential for relatively large actuation forces due to the large surface area of the actuation plates. The force on such an actuator approximates the square of the applied voltage, regardless of the actuator capacitive plate arrangement. The actuator structure of such device must be able to resist voltage breakdown, which requires effective electrical insulation between the drive electrodes and the substrate material.

U.S. Pat. No. 5,998,906, the entire content of which is incorporated herein by this reference, describes use of deep reactive ion etching (DRIE) to produce electrostatic actuators. DRIE is also described in a paper entitled, "Silicon Fusion Bonding And Deep Reactive Ion Etching; A New Technology For Microstructures" by Klassen, Peterson, Noworolski, Logan, Maluf, Brown, Storment, McCully, and Kovacs, in the Proceedings Of Transducers '95 (1995), pages 556–559. FIG. 1 schematically shows a prior art miniature device 10 made by using DRIE. The device comprises a substrate 20, an oxide layer 30 overlying the substrate 20, and a conductive layer 40 overlying the oxide layer 30. In operation, voltage applied to the conductive layer 40 is insulated from the substrate 20 by the oxide layer 30. Voltage breakdown may occur through the oxide layer 30 itself, but this is relatively unlikely if sufficiently thick (e.g. >1 micron) oxide layers are used. Voltage breakdown may also take place at the peripheral end 25 of the oxide layer 30 and the substrate 20, particularly when the cross section has been damaged in a chip sawing process. Moreover, contaminating particulates generated in the sawing process and trapped in the recess area 12 may create a voltage breakdown path between the conductive layer 40 and the substrate 20 causing operation failure of the miniature device 10. Accordingly, it is desirable to improve the device design and the process of making the device to increase maximum voltage permitted before breakdown.

In general, it is an object of the present invention to provide a miniature device having improved voltage breakdown performance.

Another object of the present invention is to provide a miniature device having an insulative layer that is partially exposed adjacent to a saw alley so that voltage breakdown due to damages of the cross section of the device caused in a sawing process is minimized.

Another object of the present invention is to provide a miniature device having an insulative layer that extends along at least a portion of the interior surface of a recess in a grounded layer so that voltage breakdown due to particulate contamination and high relative humidity on the device surfaces is prohibited.

Another object of the present invention is to provide a miniature device having an insulative layer that extends over a recess in a grounded layer so that insulative spacing between the conductive and grounded layers of the device is increased and electrical shorting between the conductive and grounded layers is inhibited.

Another object of the present invention is to provide methods of making the miniature devices having the above character.

SUMMARY OF THE INVENTION

The present invention provides a miniature device that comprises a grounded layer, an insulative layer overlying the grounded layer and a conductive layer overlying the insulative layer wherein the insulative spacing between the conductive and grounded layers is increased so as to inhibit electrical shorting between the conductive and grounded layers. In one embodiment, the insulative and grounded layers terminate at a peripheral end, and at least a portion of the insulative layer is exposed adjacent to the peripheral end to provide a relief area. In another embodiment, at least one of the grounded and conductive layers is provided with a recess, and a portion of the insulative layer extends into the recess for providing increased insulative spacing between the conductive and grounded layers. In a further embodiment, the grounded layer is provided with a recess and a portion of the insulative layer extends and overhangs the recess for providing increased insulative spacing between the conductive and grounded layers.

The present invention further provides a method of making miniature devices. The method comprises providing a substrate having a planar surface, patterning the surface of the substrate and performing an etch process to form a recess extending through the surface and defined by an interior surface, forming an insulative layer having a first portion on the planar surface of the substrate and a second portion on the interior surface of the recess, and forming a conductive layer on the first portion of the insulative layer. The step of forming an insulative layer includes thermal oxidation which comprises oxidizing the planar surface of the substrate and at least a portion of the interior surface of the recess to form an initial oxide layer, stripping the initial oxide layer, and re-oxidizing the planar surface of the substrate and the at least a portion of the interior surface of the recess to form the insulative layer.

BRIEF DESCRIPTION OF THE DRAWINGS

The accompanying drawings, which are somewhat schematic in some instances and are incorporated in and form a part of this specification, illustrate several embodiments of the invention and, together with the description, serve to explain the principles of the invention.

DESCRIPTION OF THE INVENTION

Figure 2:
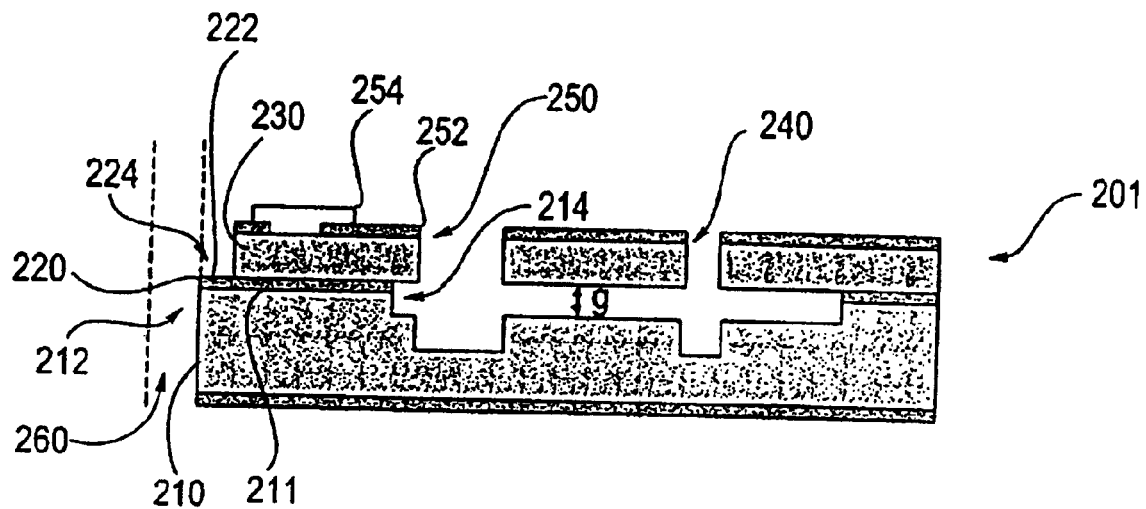
FIG. 2 is a cross-sectional view of a miniature device having an insulative layer that is partially exposed adjacent to the peripheral end of the insulative layer in accordance with one embodiment of the present invention.

The miniature device of the present invention can be in any suitable form of a miniature device, preferably a device having portions with different potentials and more preferably an electrostatic actuator such as of the type disclosed in U.S. Pat. No. 6,329,737. FIG. 2 shows a miniature device 201 having an insulative layer that is partially exposed in accordance with one embodiment of the invention. The miniature device 201 shown therein includes a grounded layer 210, an insulative layer 220 overlying the grounded layer 210, and a conductive layer 230 overlying the insulative layer 220. The grounded and insulative layers 210 and 220 are terminated at a peripheral end 212. In one embodiment, the peripheral end is adjacent to a sawing alley 260 for sawing individual chips in a sawing process. The conductive layer 230 is set back from the peripheral end 212, thus at least a portion 222 of the insulative layer 220 is exposed adjacent to the peripheral end 212.

The grounded layer 210 can be a substrate made of any suitable material such as silicon. The grounded layer 210 is preferably provided with a recess 214 defined by an interior surface for creating movable portion 240 of the conductive layer 230 as described below.

The insulative layer 220 can be a deposited layer or a layer grown from the grounded layer by thermal oxidation. The insulative layer 220 has a thickness sufficient to inhibit voltage breakdown from the conductive layer 230 to the grounded layer 210. Preferably the thickness of the insulative layer 220 ranges from 0.5 to 5 microns, more preferably from 1 to 3 microns.

The conductive layer 230 can be made of any suitable conductive material such as silicon and polysilicon, etc. The conductive layer 230 has a thickness preferably ranging from 20 to 150 micons, more preferably from 80 to 100 microns. The conductive layer 230 is coupled to an electrical source (not shown), e.g., through an electrical bond pad 254, for applying a voltage to the miniature device 201. In the embodiment where the grounded layer 210 is provided with a recess 214, the conductive layer 230 may include a stationary portion 250 and movable portion 240 made by deep reactive ion etching as described below. The stationary portion 250 is fixedly coupled to the insulative layer 220 and set back from the peripheral end 212 of the insulative and grounded layers 220 and 210 a distance preferably ranging from 10 to 100 microns, more preferably from 20 to 50 microns. The movable portion 240 is spaced from the grounded layer 210 by a gap (g), which is defined by the thickness of the insulative layer 220 and the depth of the recess 214 provided in the grounded layer 210. Preferably the gap ranges from 2 to 20 microns. The movable portion 240 can function as various moving elements of the miniature device 201 and be coupled to supporting means (not shown) such as a beam.

In preparing the miniature device 201 having an insulative layer that is partially exposed, a substrate such as a silicon wafer is provided as a grounded layer 210. An insulative layer 220 is deposited on the top surface 211 of the substrate by any suitable deposition method such as chemical vapor deposition. Alternatively, insulative layer 220 can be grown from the silicon substrate by thermal oxidation. The grounded layer 210 having insulative layer 220 on the top surface 211 is then patterned using a photoresist and etched by reactive ion etching using a high density plasma. A recess 214 is formed in the grounded layer after the etching process.

Next, a conductive layer 230 such as a silicon wafer is fusion bonded to the insulative layer 220. The conductive layer 230 is then grounded and polished to a desired thickness. An electrical bond pad 254 is provided to the conductive layer 230 for connection to an electrical source.

The conductive layer 230 is then patterned and etched through using deep reactive ion etching to achieve desired high aspect ratio structure. The final DRIE terminates on the insulative layer where present and continues etching into the grounded layer where the insulative layer is absent. This process creates a relief or offset area 224 adjacent to the peripheral end 212 of the grounded and insulative layers 210 and 220 near saw alley 260 where at least a portion 222 of the insulative layer 220 is exposed and additionally creates movable portion 240 of the conductive layer 230 spaced from the grounded layer 210.

The miniature device 201 of the invention is advantageous in reducing voltage breakdown between the conductive layer 230 and the grounded layer 210 by the provision of a relief area 224 for device 201. Usually when a silicon wafer is sawn to make individual chips, the mechanical sawing process creates damage along the vertical sawn surface. This damages includes microcracks in silicon and oxide that create voltage breakdown at that interface. The sawing damage effect is greatly mitigated by the relief area 224. Any voltage breakdown that might take place at this interface now must progress first along the exposed portion 222 of the insulating layer 220 in the relief area 224, which is relatively easy to keep clean and free of defects. Typically, a relief ranging from 10 to 50 microns is sufficient to insure that voltage breakdown does not occur in these areas.

Figure 3:
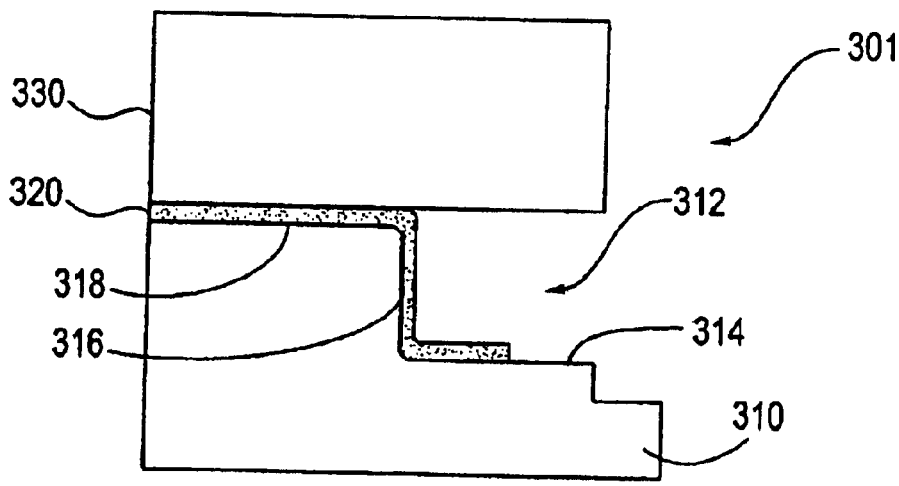
FIG. 3 is a cross-sectional view of a miniature device having an insulative layer that extends into a recess provided in a grounded layer in accordance with one embodiment of the present invention.

FIG. 3 schematically shows a miniature device 301 having an insulative layer that extends into a recess in a grounded layer in accordance with another embodiment of the invention. The miniature device 301 shown therein includes a grounded layer 310, an insulative layer 320 overlying the grounded layer 310, and a conductive layer 330 overlying the insulative layer 320. The grounded layer 310 is provided with a recess 312, and a portion of the insulative layer 320 extends into the recess 312 for providing increased insulative spacing between the conductive and grounded layers 330 and 310 so as to inhibit electrical shorting between the conductive and the grounded layers 330 and 310.

The grounded layer 310 can be made of any suitable materials as described above in connection with the miniature device 201. The recess 312 provided in the grounded layer 310 is defined by an interior surface. In one embodiment, the recess 312 is defined by at least a vertical sidewall surface 316 and a horizontal bottom surface 314 in substrate 310. The insulative layer 320 extends from the planar top surface 318 of the substrate 310 into the recess 312 and covers the vertical sidewall 316. The insulative layer 320 can continue extending along the horizontal bottom surface 314 to cover at least a portion or all of the bottom surface 314. Preferably the insulative layer 320 extends into the recess 312 a distance ranging from about 5 to 50 microns and more preferably ranging from about 10 to 20 microns. The insulative layer 320 is flat and smooth on the top surface 318 of the substrate 310, and free of bumps at the intersection between the planar surface 318 of the substrate 310 and the vertical sidewall 316 of the recess 312 so that the conductive layer 330 can be bonded to the insulative layer 320 by fusion bonding.

The conductive layer 330 of the miniature device 301 can be further patterned and etched through using DRIE to create a stationary portion (not shown) like stationary portion 250 fixedly coupled to the insulative layer 320 and a movable portion (not shown) like movable portion 240 spaced from the grounded layer 310.

Figure 1:
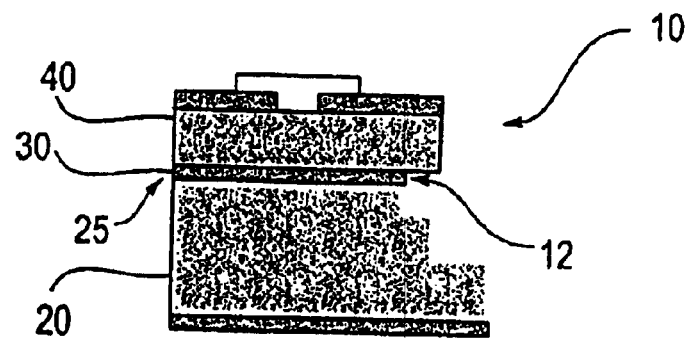
FIG. 1 is a cross-sectional view of a prior art miniature device.

The miniature device 301 having an insulative layer 320 that extends into a recess 312 in a grounded layer 310 increases insulative spacing between the conductive and grounded layers 330 and 310, is thus advantageous in inhibiting electrical shorting between the two layers. In conventional manufacturing, miniature devices are usually coated with a thick layer of photoresist to protect the recess regions under the conductive layer during a sawing process. Any particles generated during the sawing process are generally trapped on the top surface of the photoresist layer and are relatively easy to remove prior to stripping the photoresist. However, it is often difficult to completely prevent contaminating particulates from getting into recess region 312. Particulates trapped in the recess region of prior art devices, particularly where layer 40 is closest to layer 20 in device 10 shown in FIG. 1, can create a voltage breakdown path that gives rise to failure of the device when in operation. With a new process for making miniature devices of the invention as described below, the interior surface of the recess is oxidized. With these surfaces being oxidized, any voltage breakdown path between the conductive and grounded layers needs to proceed along the oxidized sidewall and at least a portion of the bottom surface at the edge of the recess region. Therefore, any small particulate contamination in the recess region will not provide a voltage breakdown path to the grounded layer.

Figure 5:
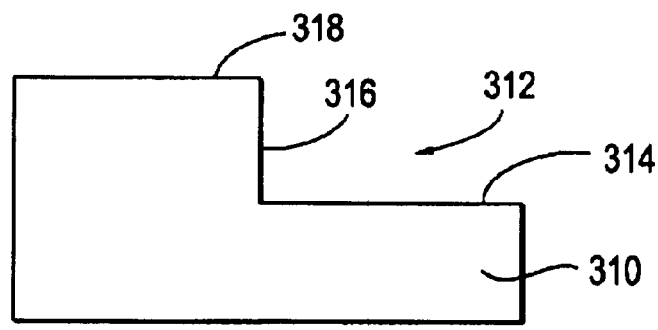
FIG. 5 is a cross-sectional view of a substrate having a top planar surface and being provided with a recess before oxidation.

FIGS. 5–9 schematically show the process for making the miniature device 301 of the invention. As shown in FIG. 5, a silicon substrate 310 having a planar top surface 318 and being provided with a recess 312 is provided. In this embodiment, the recess 312 is defined by a vertical sidewall surface 316 and a horizontal bottom surface 314 for illustrative purpose only and not with the intention to limit the scope of the invention in any way. The recess 312 can be defined by an interior surface of any shape.

Figure 6:
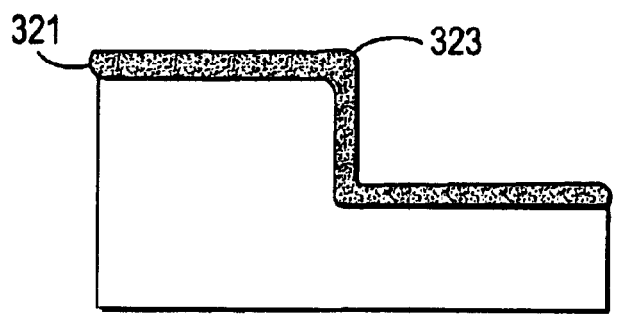
FIG. 6 is a cross-sectional view of a substrate having an oxide layer formed on the top surface and the interior surface of the recess of the substrate of FIG. 5.
Figure 7:
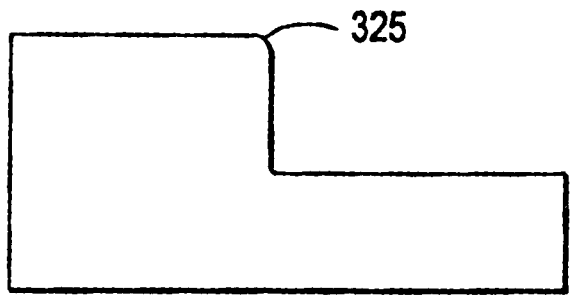
FIG. 7 is a cross-sectional view of the substrate of FIG. 6 after the oxide layer is removed.

Next, the planar surface 318 of the substrate 310 and the interior surface 316 and 314 of the recess 312 are oxidized to form an initial oxide layer 321 as shown in FIG. 6. The thermal oxidation of silicon proceeds via the diffusion of oxidizing species through a growing oxide layer and the chemical reaction of those species with the silicon substrate at the oxide-silicon interface. Thus at any exterior physical corner, oxidation tends to proceed at a slightly greater rate, as the oxidizing species can more easily diffuse to the oxide-silicon interface as compared to the rate on a flat surface. Thus, the resulting top of the initial oxide layer 321 is not perfectly flat, but rises slightly forming a bump 323 near the exterior corner 325 at the intersection of the planar surface 318 and the sidewall surface 316, as shown in FIG. 6. Similarly, the oxide-silicon interface dips slightly, rounding the exterior corner 325 as shown in FIG. 7, as more substrate silicon has been consumed during the oxidation process. Bump 323 can be a serious problem during fusion bonding. Fusion bonding only occurs if the two surfaces (typically Si—Si, Si-Oxide, or Oxide-Oxide) are almost perfectly flat and smooth. An imperfection on the order of 100 nanometer is sufficient to impede the bonding process.

The initial oxide layer 321 is stripped off from the substrate 310 to form a planar top surface 318 and a rounded exterior 325 as shown in FIG. 7.

Figure 8:
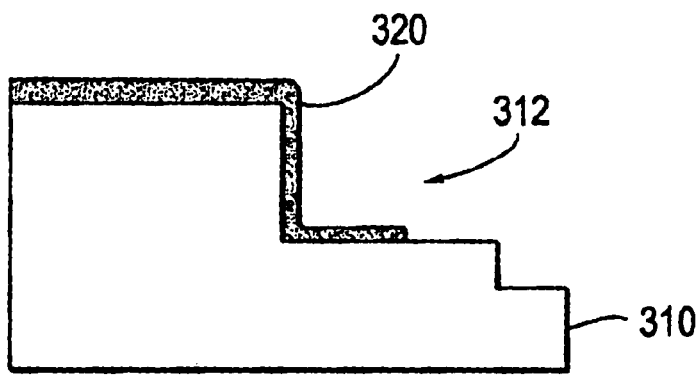
FIG. 8 is a cross-sectional view of a substrate having an oxide layer formed on the top surface and the interior surface of the recess of the substrate of FIG. 7.

Next, the substrate 310 with the initial oxide layer 321 being stripped off is reoxidized. As shown in FIG. 8, the oxide layer 320 formed in the re-oxidation process is planar and free of any appreciable bumps at the exterior corner 325 since the exterior corner 325 is rounded in the initial oxidation process as shown in FIG. 7. Alternatively, the initial oxide layer 321 is flattened using, e.g., a polishing process to form the oxide layer 320 that is planar and free of any appreciable bumps at the exterior corner 325.

Figure 9:
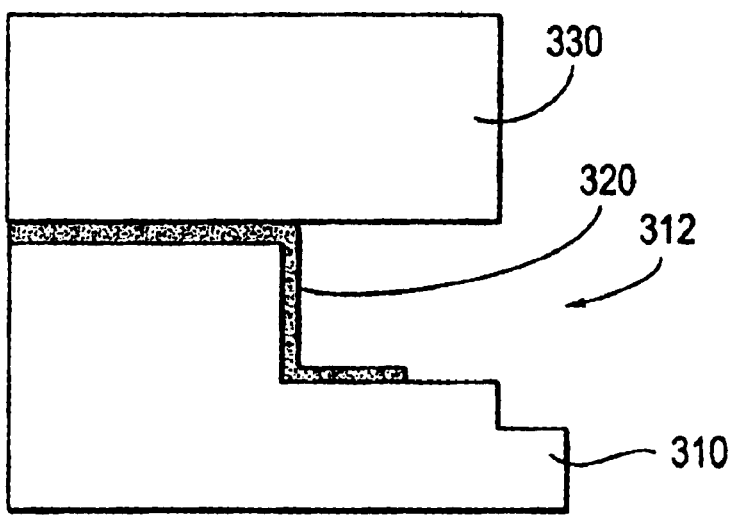
FIG. 9 is a cross-sectional view of a miniature device having a conductive layer overlying the oxide layer and the substrate of FIG. 8.

With the new process of the invention, both the top surface 318 and the interior surface 316 and 314 of the recess 312 are oxidized, forming an oxide layer 320 free of any bumps at the exterior corner 325 so that fusion bonding of a conductive layer 330 to the substrate 310 can take place as shown in FIG. 9. Further, since the interior surfaces 316 and 314 of the recess 312 are oxidized, voltage breakdown between the conductive and grounded layers 330 and 310 would necessarily be through the oxide layer 320 itself, which can be made relatively free of defects, or need to proceed along the oxidized sidewall surface 316 and a portion of the bottom surface 314 within the recess 312. This path length can typically be on the order of 10 microns or more, significantly decreasing the likelihood of breakdown and increasing the breakdown voltage. Any problems with ionic contamination that might provide a high resistance leakage current path, particularly in the presence of moisture, are reduced by having a substantially larger leakage current path.

The conductive layer 330 is then patterned and etched through using deep reactive ion etching to achieve the desired high aspect ratio structure. Conventionally, the oxide on a horizontal surface under a DRIE trench deflects ions from the plasma source and causes them to attack the bottom corner of the silicon wall, etching it back and thinning high aspect ratio silicon features such as beams. Thus when the conventional DRIE etching processes are used, it can be advantageous to remove the horizontal oxide layer underneath any vertical DRIE feature that needs to be held to tight tolerance.

It is possible to mask the top surface 318 of the substrate 310 and sidewall surface 316 of the recess 312 using relatively thick photoresist and to expose and etch the oxide on the horizontal bottom 314 of the recess 312. As a practical matter it is necessary to also mask the horizontal oxide close to the vertical sidewall 316 of the recess 312 due to the desire to provide good photoresist coverage over the top edge of the oxide where the substrate top surface 318 and recess sidewall 316 intersect. It may be necessary to use more than one photoresist coating steps to ensure that this edge is adequately protected during the oxide etch.

Figure 4:
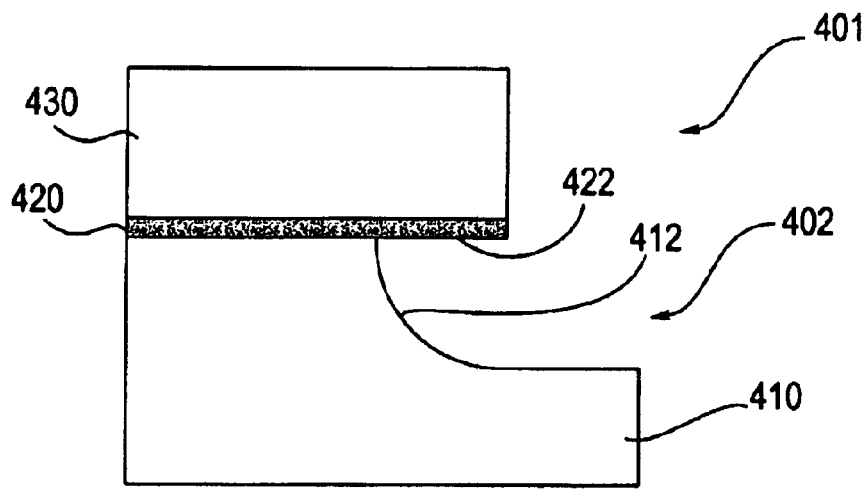
FIG. 4 is a cross-sectional view of a miniature device having an insulative layer that extends over a recess provided in a grounded layer in accordance with one embodiment of the present invention.

FIG. 4 schematically shows a miniature device 401 that can be similar to any of the exemplary devices described with respect to device 201 having an insulative layer that extends over a recess in accordance with another embodiment of the invention. The miniature device 401 shown therein includes a grounded layer 410, an insulative layer 420 overlying the grounded layer 410 and a conductive layer 430 overlying the insulative layer 420. The grounded layer 410 is provided with a recess 402 defined by an interior surface 412. A portion of the insulative layer 420 extends and overhangs the recess 412 forming a ledge 422 for providing increased insulative spacing between the conductive and grounded layers 430 and 410 so as to inhibit electrical shorting between the two layers.

The maximum length of the ledge 422 depends on the thickness of the insulative layer 420 and the process conditions used to form the insulative layer 420. For about one micron of thermal oxide insulative layer, a ledge of at least 5 micron is readily achievable.

The miniature device 401 can be prepared using isotropic etch process. A grounded layer 410 such as a substrate deposited with an insulative layer 420 is provided. The grounded and insulative layers 410 and 420 are patterned and an isotropic etch process is performed. During the isotropic etch or partially isotropic etch, the top masking layer is undercut as the etch proceeds. If a thick oxide layer is used as the oxide layer, and that layer is preserved during the subsequent steps, then there is an additional length 422 of oxide layer 420 acting to increase the length of any breakdown path from the conductive layer to the grounded layer.

As can be seen from the foregoing, a miniature device having layered structures has been provided. The miniature device has a grounded layer, an insulative layer overlying the grounded layer and a conductive layer overlying the insulative layer. The insulative spacing between the conductive and grounded layers is increased so as to inhibit electrical shorting between the conductive and grounded layers.

What is claimed is:

1. A miniature device comprising a grounded layer, an insulative layer overlying the grounded layer and a conductive layer overlying at least a portion of the insulative layer, the insulative layer and the grounded layer terminating at a peripheral end, at least a portion of the insulative layer being exposed adjacent the peripheral end for providing increased insulative spacing between the conductive layer and the grounded layer so as to inhibit electrical shorting between the conductive layer and the grounded layer.

2. The miniature device of claim 1 wherein the conductive layer is set back from the peripheral end in a distance ranging from about 10 to 100 microns.

3. The miniature device of claim 1 wherein the peripheral end is a sawn end.

4. The miniature device of claim 1 wherein the grounded layer is a silicon substrate.

5. The miniature device of claim 1 wherein the insulative layer is a deposited layer.

6. The miniature device of claim 1 wherein the insulative layer is an oxide layer.

7. The miniature device of claim 1 wherein the insulative layer is silicon dioxide.

8. The miniature device of claim 1 wherein the grounded layer is provided with a recess, the conductive layer having a stationary portion fixedly coupled to the insulative layer and a movable portion spaced above the grounded layer by a gap.

9. The miniature device of claim 8 further comprising a second insulative layer overlying the stationary and movable portions of the conductive layer, the stationary portion being provided with an electrical bond pad.

10. A miniature device comprising a grounded layer, an insulative layer overlying the grounded layer and a conductive layer overlying the insulative layer, at least one of the grounded layer and the conductive layer being provided with a recess, a portion of the insulative layer extending into the recess for providing increased insulative spacing between the conductive layer and the grounded layer so as to inhibit electrical shorting between the conductive layer and the grounded layer.

11. The miniature device of claim 10 wherein the insulative layer is planar and free of bumps at an intersection between a planar surface of the grounded layer and an interior surface of the recess.

12. The miniature device of claim 10 wherein the recess is defined by a vertical sidewall surface and a horizontal bottom surface, the insulative layer extending along the sidewall surface of the recess.

13. The miniature device of claim 12 wherein the insulating layer extends along at least a portion of the horizontal bottom surface of the recess.

14. The miniature device of claim 12 wherein the insulative layer covers the horizontal bottom surface of the recess.

15. The miniature device of claim 10 wherein the insulative layer extends a distance ranging from about 5 to 50 microns within the recess.

16. The miniature device of claim 10 wherein the insulative layer and the grounded layer terminate at a peripheral end and the conductive layer is set back from the peripheral end.

17. The miniature device of claim 10 wherein the conductive layer has a stationary portion fixedly coupled to the grounded layer and a movable portion spaced above the grounded layer by a gap.

18. A miniature device comprising a grounded layer, an insulative layer overlying the grounded layer and a conductive layer overlying the insulative layer, the grounded layer being provided with a recess and a portion of the insulative layer extending over the recess for providing increased insulative spacing between the conductive layer and the grounded layer so as to inhibit electrical shorting between the conductive layer and the grounded layer.

19. The miniature device of claim 18 wherein the insulative layer has a thickness ranging from one half to five microns and extends over the recess a distance ranging from two to ten microns.

20. The miniature device of claim 18 wherein the recess is formed by isotropic etching of the grounded layer.

21. A method of making a miniature device comprising:

providing a substrate having a planar surface;

patterning the surface of the substrate and performing an etch process to form a recess extending through the surface and defined by an interior surface;

forming an insulative layer having a first portion on the planar surface of the substrate and a second portion on the interior surface of the recess; and forming a conductive layer on the first portion of the insulative layer.

22. The method of claim 21 wherein the step of forming an insulative layer includes oxidizing the planar surface of the substrate and at least a portion of the interior surface of the recess.

23. The method of claim 21 wherein the step of forming an insulative layer includes:
- oxidizing the planar surface of the substrate and at least a portion of the interior surface of the recess to form an initial oxide layer;
- stripping the initial oxide layer; and
- re-oxidizing the planar surface of the substrate and the at least a portion of the interior surface of the recess to form the insulative layer.

24. The method of claim 21 wherein the step of forming an insulative layer includes:
- oxidizing the planar surface of the substrate and at least a portion of the interior surface of the recess to form an initial oxide layer; and
- flattening the initial oxide layer to form the insulative layer.

25. The method of claim 21 wherein the recess is defined by a vertical sidewall surface and a horizontal bottom surface and the step of forming an insulative layer includes forming an insulative layer on the sidewall surface and at least a portion of the horizontal bottom surface.

26. The method of claim 25 wherein the step of forming an insulative layer includes covering the horizontal bottom surface.

27. The method of claim 21 wherein the step of forming a conductive layer on the insulative layer includes fusion bonding the conductive layer to the insulative layer.

28. The method of claim 21 further comprising the step of patterning the conductive layer, performing a second etch process to etch through the conductive layer to form a stationary portion of the conductive layer fixedly coupled to the insulative layer and a movable portion of the conductive layer spaced above the substrate by a gap.

29. The method of claim 28 wherein the step of performing a second etch process includes deep reactive ion etching.

30. The method of claim 21 wherein the insulative layer and the substrate terminate at a peripheral end, further comprising setting the conductive layer back from the peripheral end.

* * * * *